(12) United States Patent
Tiwari et al.

(10) Patent No.: US 10,699,787 B2
(45) Date of Patent: Jun. 30, 2020

(54) SYSTEM AND METHOD FOR MINIMIZING FLOATING GATE TO FLOATING GATE COUPLING EFFECTS DURING PROGRAMMING IN FLASH MEMORY

(71) Applicant: Silicon Storage Technology, Inc., San Jose, CA (US)

(72) Inventors: Vipin Tiwari, Dublin, CA (US); Nhan Do, Saratoga, CA (US); Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/783,286

(22) Filed: Feb. 6, 2020

(65) Prior Publication Data
US 2020/0176060 A1    Jun. 4, 2020

Related U.S. Application Data

(62) Division of application No. 15/849,268, filed on Dec. 20, 2017, now Pat. No. 10,600,484.

(51) Int. Cl.
| | |
|---|---|
| *G11C 16/10* | (2006.01) |
| *G11C 11/56* | (2006.01) |
| *G11C 16/04* | (2006.01) |
| *H01L 29/788* | (2006.01) |
| *H01L 29/423* | (2006.01) |

(52) U.S. Cl.
CPC .......... *G11C 16/10* (2013.01); *G11C 11/5628* (2013.01); *G11C 16/0425* (2013.01); *G11C 16/0483* (2013.01); *H01L 29/42328* (2013.01); *H01L 29/7885* (2013.01); *G11C 2211/5648* (2013.01)

(58) Field of Classification Search
CPC ........................... G11C 16/10; G11C 11/5628
USPC .................................................... 365/185.03
See application file for complete search history.

(56) References Cited

U.S. PATENT DOCUMENTS

| | | |
|---|---|---|
| 5,029,130 A | 7/1991 | Yeh |
| 6,400,624 B1 | 6/2002 | Parker |
| 7,315,056 B2 | 1/2008 | Klinger |

(Continued)

FOREIGN PATENT DOCUMENTS

JP    4372196 B2    11/2009

*Primary Examiner* — Huan Hoang
*Assistant Examiner* — Muna A Techane
(74) *Attorney, Agent, or Firm* — DLA Piper LLP (US)

(57) ABSTRACT

An improved programming technique for non-volatile memory cell arrays, in which memory cells to be programmed with higher programming values are programmed first, and memory cells to be programmed with lower programming values are programmed second. The technique reduces or eliminates the number of previously programmed cells from being adversely incrementally programmed by an adjacent cell being programmed to higher program levels, and reduces the magnitude of adverse incremental programming for most of the memory cells, which is caused by floating gate to floating gate coupling. The memory device includes an array of non-volatile memory cells and a controller configured to identify programming values associated with incoming data, and perform a programming operation in which the incoming data is programmed into at least some of the non-volatile memory cells in a timing order of descending value of the programming values.

16 Claims, 4 Drawing Sheets

(56) References Cited

U.S. PATENT DOCUMENTS

| | | | |
|---|---|---|---|
| 7,868,375 B2 | 1/2011 | Liu | |
| 7,898,863 B2* | 3/2011 | Aritome | G11C 11/5642 |
| | | | 365/185.02 |
| 8,539,311 B2* | 9/2013 | Steiner | G06F 11/1072 |
| | | | 714/764 |
| 9,026,722 B2 | 5/2015 | Kamphenkel | |
| 2005/0146932 A1* | 7/2005 | Lee | G11C 16/3468 |
| | | | 365/185.05 |
| 2007/0233939 A1 | 10/2007 | Kim | |
| 2010/0157675 A1 | 6/2010 | Shalvi | |
| 2012/0163080 A1 | 6/2012 | Shalvi | |
| 2013/0083607 A1 | 4/2013 | Joo et al. | |

* cited by examiner

SYSTEM AND METHOD FOR MINIMIZING FLOATING GATE TO FLOATING GATE COUPLING EFFECTS DURING PROGRAMMING IN FLASH MEMORY

RELATED APPLICATIONS

This application is a divisional of U.S. application Ser. No. 15/849,268, filed Dec. 20, 2017.

FIELD OF THE INVENTION

The present invention relates to non-volatile memory devices, and more particularly to optimization of operational voltages.

BACKGROUND OF THE INVENTION

Non-volatile memory devices are well known in the art. For example, a split-gate memory cell is disclosed in U.S. Pat. No. 5,029,130 (which is incorporated herein by reference for all purposes). This memory cell has a floating gate and a control gate disposed over and controlling the conductivity of a channel region of the substrate extending between source and drain regions. Various combinations of voltages are applied to the control gate, source and drain to program the memory cell (by injecting electrons onto the floating gate), to erase the memory cell (by removing electrons from the floating gate), and to read the memory cell (by measuring or detecting the conductivity of the channel region to determine the programming state of the floating gate).

The configuration and number of gates in non-volatile memory cells can vary. For example, U.S. Pat. No. 7,315,056 (which is incorporated herein by reference for all purposes) discloses a memory cell that additionally includes a program/erase gate over the source region. U.S. Pat. No. 7,868,375 (which is incorporated herein by reference for all purposes) discloses a memory cell that additionally includes an erase gate over the source region and a coupling gate over the floating gate.

Historically, the above described memory cells were used in a digital manner, meaning that the memory cells had two programmed states: the programmed state (i.e., the 0 state), and the unprogrammed state (i.e., the erased or 1 state). More recently, applications have been developed for the above described memory cells in which the memory cells are programmed and erased in an analog fashion so that each memory cell can be programmed to a programmed state anywhere within a continuous analog program state range. Or, the memory cells are programmed and erased in a digital fashion, where each memory cell can be programmed to one of many possible programming states. Either way, the program and erase operations are performed incrementally (e.g., using a series of program or erase pulses, and measuring the program state between pulses) until the desired program state is achieved. In both cases, the memory cells require precise programming of their programming states.

For all the above referenced memory cells, the memory cells are configured in an array of rows and columns. The conventional technique of programming memory cells is sequential, row by row, cell by cell, starting with the first memory cell in the row, and moving on to the next memory cell, and so on one cell at a time, until the entire row is programmed. However, as critical dimensions shrink, it has been discovered that cross coupling between adjacent floating gates in the same row can result in the programming state of one floating gate being adversely affected by the programming operation on an adjacent memory cell. For example, if the first memory cell in the row is programmed, and then the second memory cell in the row is programmed, the programming of the second memory cell can change the programming state of the first memory cell through floating gate to floating gate coupling, and so on, causing unwanted programming errors to occur in some memory cells. The magnitude of adverse incremental programming is proportional to the level of programming of the adjacent cell. The higher the programming level of any given cell, the worse aggressor it becomes to its neighboring cells.

There is a need for a non-volatile memory array operational technique that reduces the amount of programming errors caused by cross coupling between adjacent memory cells.

BRIEF SUMMARY OF THE INVENTION

The aforementioned problems and needs are addressed by a memory device that includes an array of non-volatile memory cells and a controller. Each of the non-volatile memory cells includes a floating gate. The controller is configured to identify programming values associated with incoming data, wherein each of the programming values is associated with a relative amount of electrons to be placed onto one of the floating gates, associate each data of the incoming data with one of a plurality of data groups based on the programming value associated therewith, wherein each of the data groups is associated with a unique programming value or a unique range of programming values, and perform a programming operation in which the data groups of the incoming data are programmed into at least some of the non-volatile memory cells in a timing order of descending value of the unique programming values or the unique range of programming values of the plurality of data groups.

A method of operating a memory device (that includes an array of non-volatile memory cells, wherein each of the non-volatile memory cells includes a floating gate) includes identifying programming values associated with incoming data, wherein each of the programming values is associated with a relative amount of electrons to be placed onto one of the floating gates, associating each data of the incoming data with one of a plurality of data groups based on the programming value associated therewith, wherein each of the data groups is associated with a unique programming value or a unique range of programming values, and performing a programming operation in which the data groups of the incoming data are programmed into at least some of the non-volatile memory cells in a timing order of descending value of the unique programming values or the unique range of programming values of the plurality of data groups.

Other objects and features of the present invention will become apparent by a review of the specification, claims and appended figures.

DETAILED DESCRIPTION OF THE INVENTION

Figure 1:
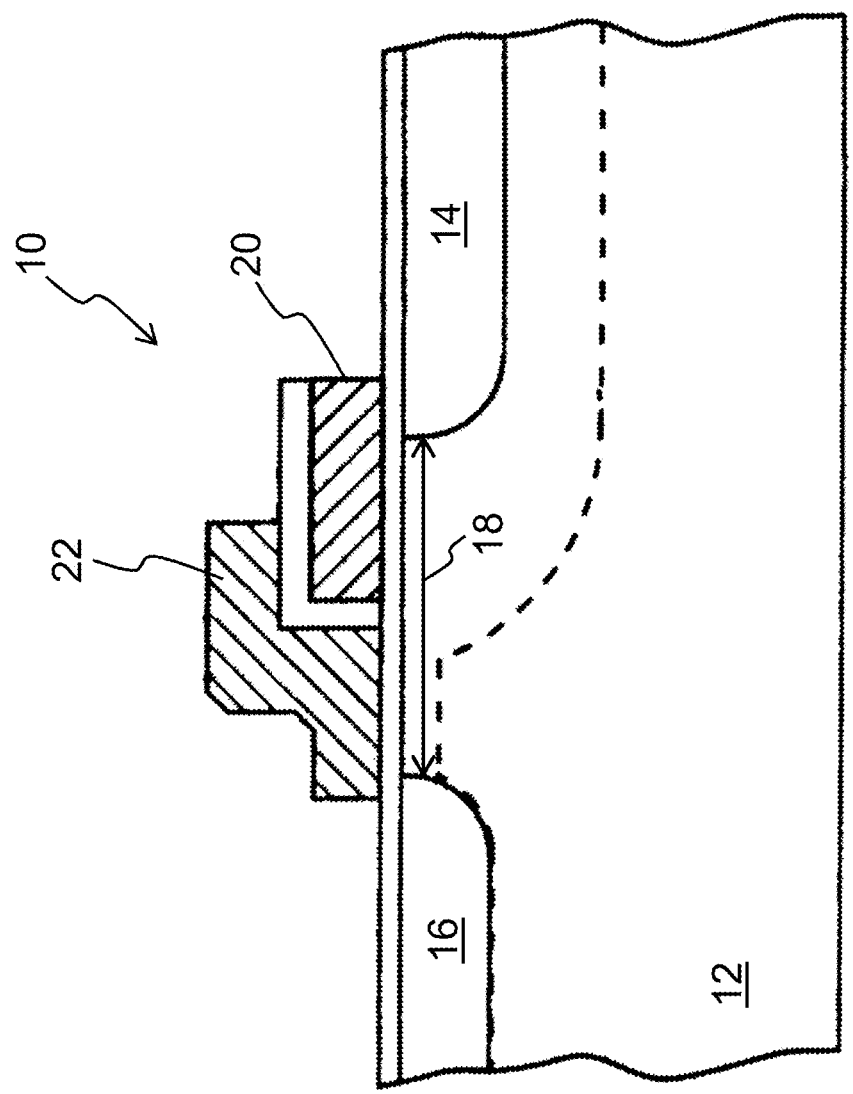
FIG. 1 is a side cross sectional view of a first split gate non-volatile memory cell.

The present invention is directed to an improved programming technique for non-volatile memory cell arrays, in which memory cells to be programmed with higher programming values are programmed first, and memory cells to be programmed with lower programming values are programmed second. With this technique, memory cells that are adversely incrementally programmed from adjacent cells (which are being programmed to a higher programming value) will most likely not yet be programmed to their full programming value, and will reach that full programming value in subsequent programming. Memory cells that already have been programmed and are subjected to adverse incremental programming from adjacent cells being programmed may still be adversely affected, but the magnitude of the adverse effect is lessened because the adjacent cells are being programmed to a lesser or equal programming value than the adversely affected cell. This technique reduces or eliminates the number of previously programmed cells from being adversely incrementally programmed by an adjacent cell being programmed to the highest program levels, and reduces the magnitude of adverse incremental programming for most of the memory cells.

The programming technique of the present invention begins by performing an iterative search of the data to be programmed to any given row, to identify which memory cells are to be programmed at the highest programming level, which memory cells are to be programmed at the next highest programming level, and so on. Then, the row of memory cells is programmed as follows. First, the memory cells to be programmed at the highest programming level are programmed first. Then, the memory cells to be programmed at the next highest programming level are programmed next, and so on. The process continues until the memory cells to be programmed at the lowest programming level are programmed. This means that incoming data associated with the highest programming value (to store the data in the memory cells) is programmed first, following by incoming data associated with the next highest programming value is programmed next, and so on, until the incoming data associated with the lowest programming value is programmed last. In this manner, adverse incremental programming of previously programmed memory cells from subsequently programming memory cells is minimized.

As described in further detail below, memory cells are often configured in pairs extending in the column direction, sharing a common source line. Therefore, there can also be adverse incremental programming between memory cells in the column direction (across the common source line). Therefore, as a first alternate embodiment, the programming technique of the present invention can begin by performing an iterative search of the data to be programmed to any two rows sharing a common source line, to identify which memory cells are to be programmed at the highest programming level, which memory cells are to be programmed at the next highest programming level, and so on. Then, the two rows memory cells are programmed as follows. First, the memory cells in both rows to be programmed at the highest programming level are programmed first. Then, the memory cells in both rows to be programmed at the next highest programming level are programmed next, and so on. The process continues until the memory cells in both rows to be programmed at the lowest programming level are programmed. Again, this means that incoming data associated with the highest programming value (for storing the data in the memory cells) for the two rows is programmed first, following by incoming data associated with the next highest programming value for the two rows is programmed next, and so on, until the incoming data associated with the lowest programming value for the two rows is programmed last. In this manner, adverse incremental programming of previously programmed memory cells from subsequently programming memory cells is minimized both in the row direction and in the column direction.

In a second alternate embodiment, all memory cells in the row or pair of rows can be pre-programmed to a certain intermediate value (e.g., to 50% of their target programming values for storing the incoming data) in any order, including a sequential cell order. Then, the memory cells complete their programming according to the above described methodology, with the memory cells to be programmed at the highest programming value being programmed first, then the memory cells to programmed at the next highest programming value being programmed next, and so on. In this manner, the magnitude of any adverse sequential programming is further reduced.

While it is preferable to program the memory cells in descending sequential order of programming value as dictated by the incoming data, the goals of the present invention can be achieved by grouping the memory cells in two or more groups, where the first group that is programmed has associated programming values in a range that is greater than the programming value range of the next group, and so on. This grouping does not change which cells store which data, it only dictates the timing order in which the cells are programmed. This means that incoming data is grouped in two or more groups based upon the programming value ranges associated therewith needed to store the data in the memory cells. The group of incoming data associated with the highest range of programming values is programmed first, followed by the group of incoming data associated with the next highest range of programming values is programmed next, and so on, until the group of incoming data associated with the lowest range of programming values is programmed last. Again, this grouping does not change which data goes with which cell, it only dictates the timing order in which the incoming data is programmed. The higher the number of groups, the more granular the incoming data is grouped, and the more that the magnitude of adverse sequential programming can be minimized. The magnitude of adverse sequential programming should be fully minimized when the number of groups equals the number of data in the incoming data (i.e., each group is just one of the data for one of the cells, which is the most granular that the incoming data can be grouped, and results in the programming by descending sequential order of programming value as discussed above).

The technique of minimizing adverse sequential programming can be implemented in any non-volatile memory cell design. For example, FIG. 1 illustrates a split gate memory cell 10 with spaced apart source and drain regions 14/16 formed in a silicon semiconductor substrate 12. A channel region 18 of the substrate is defined between the source/drain regions 14/16. A floating gate 20 is disposed over and insulated from a first portion of the channel region 18 (and partially over and insulated from the source region 14). A control gate (also referred to as a word line gate or select gate) 22 has a lower portion disposed over and insulated from a second portion of the channel region 18, and an upper portion that extends up and over the floating gate 20 (i.e., the control gate 22 wraps around an upper edge of the floating gate 20).

Memory cell 10 can be erased by placing a high positive voltage on the control gate 22, and a reference potential on the source and drain regions 14/16. The high voltage drop between the floating gate 20 and control gate 22 will cause electrons on the floating gate 20 to tunnel from the floating gate 20, through the intervening insulation, to the control gate 22 by the well-known Fowler-Nordheim tunneling mechanism (leaving the floating gate 20 positively charged—the erased state). Memory cell 10 can be programmed by applying a ground potential to drain region 16, a positive voltage on source region 14, and a positive voltage on the control gate 22. Electrons will then flow from the drain region 16 toward the source region 14, with some electrons becoming accelerated and heated whereby they are injected onto the floating gate 20 (leaving the floating gate negatively charged—the programmed state). Memory cell 10 can be read by placing ground potential on the drain region 16, a positive voltage on the source region 14 and a positive voltage on the control gate 22 (turning on the channel region portion under the control gate 22). If the floating gate is positively charged (erased), electrical current will flow from source region 14 to drain region 16. The more the floating gate 20 is negatively charged (i.e., the more it is programmed), the less conductive the channel region under the floating gate will be. By sensing current flow, the programming state of the memory cell can be sensed.

Figure 2:
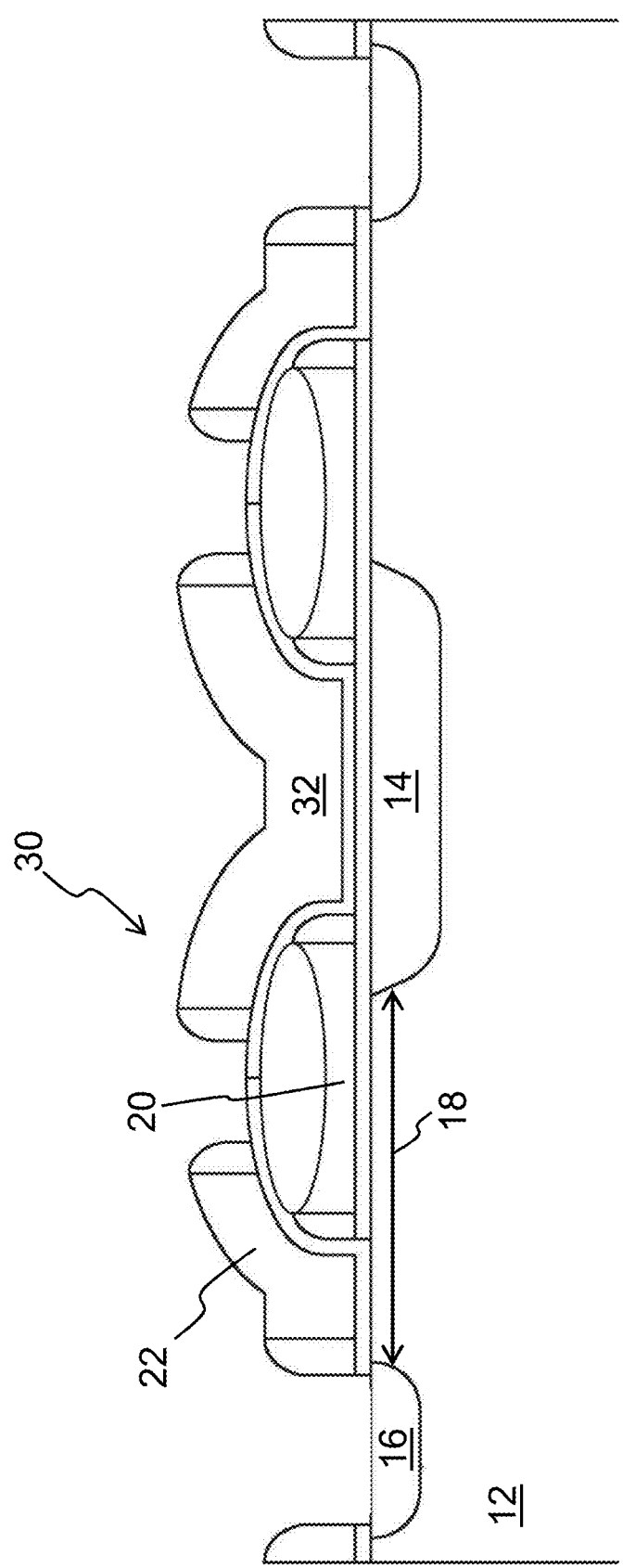
FIG. 2 is a side cross sectional view of a second split gate non-volatile memory cell.

FIG. 2 illustrates an alternate split gate memory cell 30 with same elements as memory cell 10, but additionally with a program/erase (PE) gate 32 disposed over and insulated from the source region 14 (i.e. this is a three gate design). Memory cell 30 can be erased by placing a high voltage on the PE gate 32 to induce tunneling of electrons from the floating gate 20 to the PE gate 32. Memory cell 30 can be programmed by placing positive voltages on the control gate 22, PE gate 32 and source region 14, and a current on drain region 16, to inject electrons from the current flowing through the channel region 18 onto floating gate 20. Memory cell 30 can be read by placing positive voltages on the control gate 22 and drain region 16, and sensing current flow.

Figure 3:
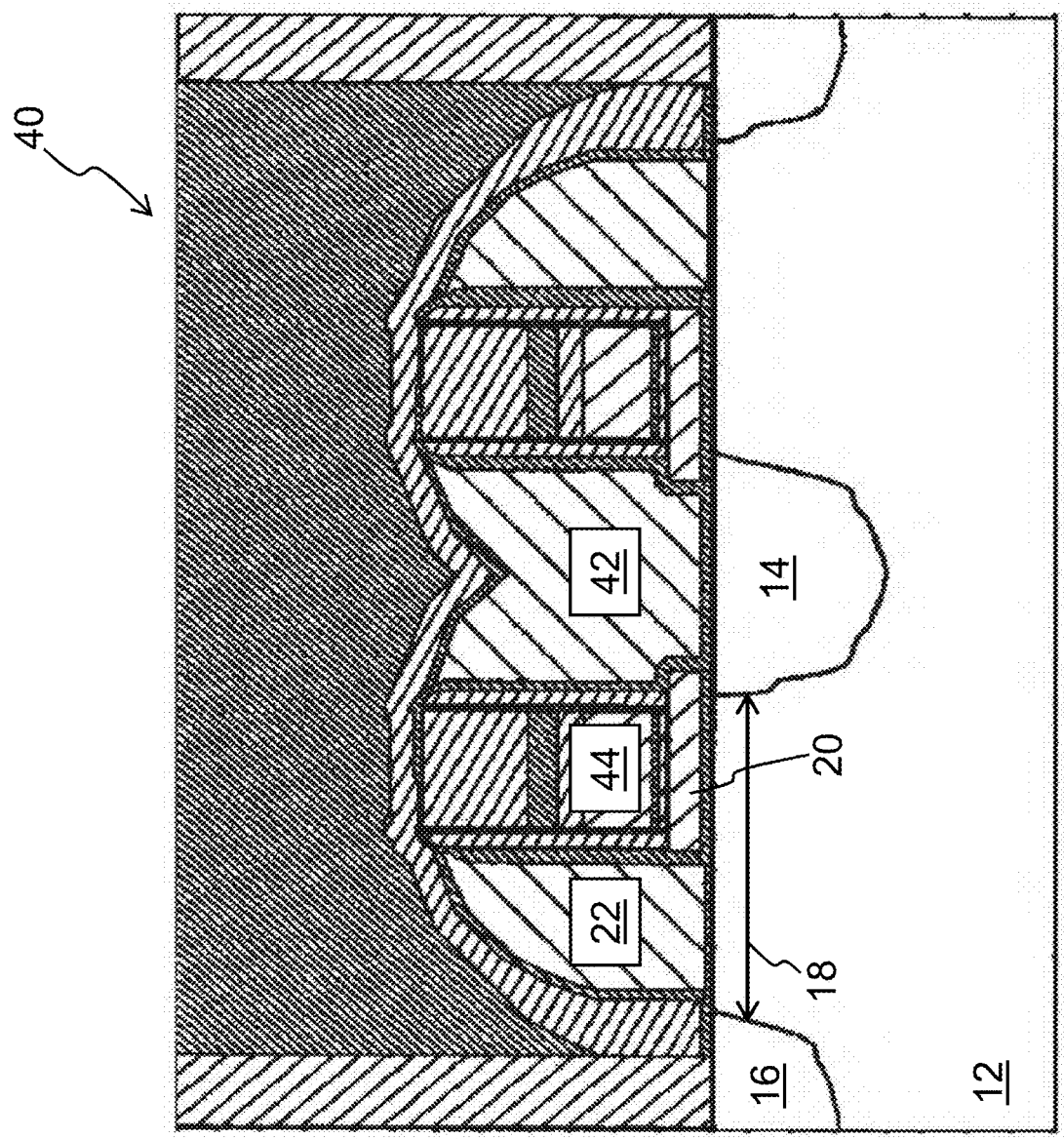
FIG. 3 is a side cross sectional view of a third split gate non-volatile memory cell.

FIG. 3 illustrates an alternate split gate memory cell 40 with same elements as memory cell 10, but additionally with an erase gate 42 disposed over and insulated from the source region 14, and a coupling gate 44 over and insulated from the floating gate 20. Memory cell 40 can be erased by placing a high voltage on the erase gate 42 and optionally a negative voltage on the coupling gate 44 to induce tunneling of electrons from the floating gate 20 to the erase gate 42. Memory cell 40 can be programmed by placing positive voltages on the control gate 22, erase gate 42, coupling gate 44 and source region 14, and a current on drain region 16, to inject electrons from the current flowing through the channel region 18 onto floating gate 20. Memory cell 30 can be read by placing positive voltages on the control gate 22 and drain region 16 (and optionally on the erase gate 42 and/or the coupling gate 44), and sensing current flow.

Figure 4:
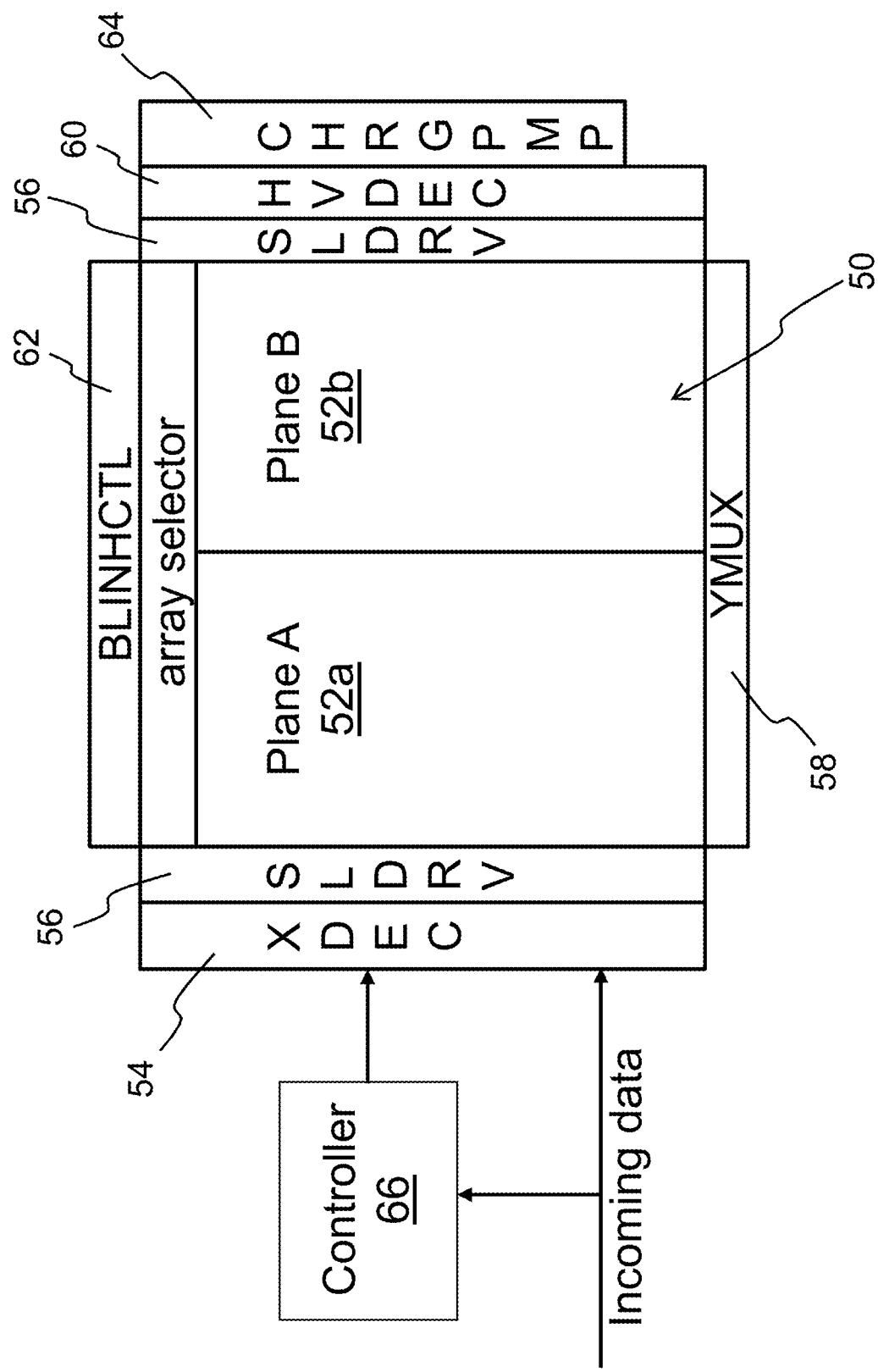
FIG. 4 is a plan view of the memory device architecture of the present invention.

The architecture of the memory device of the present invention is illustrated in FIG. 4. The memory device includes an array 50 of non-volatile memory cells, which can be segregated into two separate planes (Plane A 52a and Plane B 52b). The memory cells can be of the type shown in FIGS. 1-3, formed on a single chip, arranged in a plurality of rows and columns in the semiconductor substrate 12. Adjacent to the array of non-volatile memory cells are address decoders (e.g. XDEC 54 (row decoder), SLDRV 56, YMUX 58 (column decoder), HVDEC 60) and a bit line controller (BLINHCTL 62), which are used to decode addresses and supply the various voltages to the various memory cell gates and regions during read, program, and erase operations for selected memory cells. Controller 66 (containing control circuitry) controls the various device elements to implement each operation (program, erase, read) on target memory cells. Charge pump CHRGPMP 64 provides the various voltages used to read, program and erase the memory cells under the control of the controller 66. The controller 66 determines from the incoming data the timing order in which memory cells are to be programmed with that incoming data, and implements programming of the memory cells according to that timing order, as discussed herein.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device, comprising:
   an array of non-volatile memory cells, wherein each of the non-volatile memory cells includes a floating gate, and
   a controller configured to:
   identify programming values associated with incoming data, wherein each of the programming values is associated with a relative amount of electrons to be placed onto one of the floating gates;
   associate each data of the incoming data with one of a plurality of data groups based on the programming value associated therewith, wherein each of the data groups is associated with a unique programming value or a unique range of programming values;

perform a programming operation in which the data groups of the incoming data are programmed into at least some of the non-volatile memory cells in a timing order of descending value of the unique programming values or the unique range of programming values of the plurality of data groups.

2. The memory device of claim 1, wherein the plurality of data groups is two data groups.

3. The memory device of claim 1, wherein the plurality of data groups is equal to a number of data in the incoming data.

4. The memory device of claim 1, wherein the non-volatile memory cells are arranged in rows and columns, and wherein the plurality of data groups is equal to a number of the non-volatile memory cells in one of the rows of the non-volatile memory cells.

5. The memory device of claim 1, wherein the non-volatile memory cells are arranged in rows and columns, and wherein the plurality of data groups is equal to a number of the non-volatile memory cells in two of the rows of the non-volatile memory cells.

6. The memory device of claim 1, wherein the non-volatile memory cells are arranged in rows and columns, and wherein the at least some of the non-volatile memory cells is one of the rows of the non-volatile memory cells.

7. The memory device of claim 1, wherein the non-volatile memory cells are arranged in rows and columns, and wherein the at least some of the non-volatile memory cells is two of the rows of the non-volatile memory cells.

8. The memory device of claim 1, wherein the controller is further configured to:
pre-program each of the at least some of the non-volatile memory cells to an intermediate program value before the performing of the programming operation.

9. A method of operating a memory device that includes an array of non-volatile memory cells, wherein each of the non-volatile memory cells includes a floating gate, the method comprising:
identifying programming values associated with incoming data, wherein each of the programming values is associated with a relative amount of electrons to be placed onto one of the floating gates;
associating each data of the incoming data with one of a plurality of data groups based on the programming value associated therewith, wherein each of the data groups is associated with a unique programming value or a unique range of programming values;
performing a programming operation in which the data groups of the incoming data are programmed into at least some of the non-volatile memory cells in a timing order of descending value of the unique programming values or the unique range of programming values of the plurality of data groups.

10. The method of claim 9, wherein the plurality of data groups is two data groups.

11. The method of claim 9, wherein the plurality of data groups is equal to a number of data in the incoming data.

12. The method of claim 9, wherein the non-volatile memory cells are arranged in rows and columns, and wherein the plurality of data groups is equal to a number of the non-volatile memory cells in one of the rows of the non-volatile memory cells.

13. The method of claim 9, wherein the non-volatile memory cells are arranged in rows and columns, and wherein the plurality of data groups is equal to a number of the non-volatile memory cells in two of the rows of the non-volatile memory cells.

14. The method of claim 9, wherein the non-volatile memory cells are arranged in rows and columns, and wherein the at least some of the non-volatile memory cells is one of the rows of the non-volatile memory cells.

15. The method of claim 9, wherein the non-volatile memory cells are arranged in rows and columns, and wherein the at least some of the non-volatile memory cells is two of the rows of the non-volatile memory cells.

16. The method of claim 9, further comprising:
pre-programming each of the at least some of the non-volatile memory cells to an intermediate program value before the performing of the programming operation.

\* \* \* \* \*